(12) United States Patent
Gueckel

(10) Patent No.: US 7,828,561 B2
(45) Date of Patent: Nov. 9, 2010

(54) PIN FOR INSERTION INTO A RECEIVING OPENING IN A PRINTED CIRCUIT BOARD AND METHOD FOR INSERTING A PIN INTO A RECEIVING OPENING IN A PRINTED CIRCUIT BOARD

(75) Inventor: Richard Gueckel, Pfalz (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/305,406

(22) PCT Filed: Feb. 4, 2008

(86) PCT No.: PCT/EP2008/051317

§ 371 (c)(1),
(2), (4) Date: Apr. 29, 2009

(87) PCT Pub. No.: WO2008/116687

PCT Pub. Date: Oct. 2, 2008

(65) Prior Publication Data

US 2009/0298312 A1     Dec. 3, 2009

(30) Foreign Application Priority Data

Mar. 26, 2007    (DE)   .................... 10 2007 014 356

(51) Int. Cl.
*H01R 13/42* (2006.01)
(52) U.S. Cl. ........................... 439/82; 439/751
(58) Field of Classification Search ............ 439/82, 439/751
See application file for complete search history.

(56) References Cited

U.S. PATENT DOCUMENTS

| | | | |
|---|---|---|---|
| 3,536,869 A * | 10/1970 | Renshaw, Jr. ............ | 200/51.1 |
| 3,846,741 A * | 11/1974 | Kunkle et al. ............ | 439/82 |
| 4,684,203 A * | 8/1987 | Bihler ............ | 439/751 |
| 4,735,587 A * | 4/1988 | Kirayoglu ............ | 439/751 |
| 4,795,353 A * | 1/1989 | Baker ............ | 439/92 |
| 5,054,192 A | 10/1991 | Cray et al. | |

(Continued)

FOREIGN PATENT DOCUMENTS

DE    1 923 880    11/1970

(Continued)

OTHER PUBLICATIONS

International Search Report, PCT International Patent Application No. PCT/EP2008/051317, dated Feb. 4, 2008.

*Primary Examiner*—Gary F. Paumen
(74) *Attorney, Agent, or Firm*—Kenyon & Kenyon LLP

(57) ABSTRACT

A pin having a contact part may be inserted into a receiving opening in a printed circuit board and anchored in the receiving opening with a press fit. Also, a method provides for inserting a pin into a receiving opening in a printed circuit board, in which the pin is inserted into the receiving opening from one side of the printed circuit board, and a contact part of the pin is anchored in the receiving opening with a press fit. The contact part is inserted into the receiving opening in a contactless manner or with a sliding fit and is subsequently deformed within the receiving opening by expansion transversally to the insertion direction in order to anchor the contact part in the receiving opening with a press fit.

6 Claims, 1 Drawing Sheet

U.S. PATENT DOCUMENTS

| | | | |
|---|---|---|---|
| 5,083,928 A * | 1/1992 | Aikens et al. | 439/82 |
| 5,120,257 A * | 6/1992 | Hahn | 439/567 |
| 5,199,907 A * | 4/1993 | Jansen et al. | 439/751 |
| 5,492,490 A | 2/1996 | Longueville | |
| 5,664,973 A * | 9/1997 | Emmert et al. | 439/862 |
| 6,062,916 A * | 5/2000 | Gladd et al. | 439/751 |
| 6,450,839 B1 * | 9/2002 | Min et al. | 439/751 |
| 7,008,272 B2 * | 3/2006 | Blossfeld | 439/751 |
| 7,210,969 B1 * | 5/2007 | Hashimoto | 439/751 |
| 2006/0264076 A1 | 11/2006 | Chen | |
| 2007/0010139 A1 | 1/2007 | Chen | |

FOREIGN PATENT DOCUMENTS

| | | |
|---|---|---|
| DE | 28 06 683 | 8/1979 |
| DE | 0 492 017 | 7/1992 |
| DE | 93 03 464.4 | 6/1993 |
| DE | 3884803 | 3/1994 |
| DE | 0 632 543 | 1/1995 |
| DE | 102 19 427 | 11/2003 |
| DE | 10 2006 041 978 | 3/2008 |

* cited by examiner

PIN FOR INSERTION INTO A RECEIVING OPENING IN A PRINTED CIRCUIT BOARD AND METHOD FOR INSERTING A PIN INTO A RECEIVING OPENING IN A PRINTED CIRCUIT BOARD

FIELD OF INVENTION

The present invention relates to a pin, and a method for inserting a pin into a receiving opening in a printed circuit board.

BACKGROUND INFORMATION

For situations in automotive technology and other fields in which safe and reliable functioning of control systems is of particular importance, such as for electronic control systems for airbags or other passenger restraint devices, control systems for automatic antilock braking systems (ABS), devices for vehicle dynamics control (ESP), or engine and transmission control systems, the so-called press-in technique, a cold contact method in which one or more projecting press-in pins for the electronic components are inserted with a press fit into complementary receiving openings in the printed circuit board, is being increasingly used for manufacturing high-quality electrical contacts between a printed circuit board and one or more electronic components subsequently installed on the printed circuit board. However, the press-in technique is also used in other fields for subsequent installation of electronic components on printed circuit boards, for example in controllers for power window modules or rear window washer systems in motor vehicles.

The press-in pins which are used have a press-in zone designed as a spring, which in the course of pressing the press-in pins into the receiving openings in the printed circuit board are pushed together transversally to the press-in direction, while the receiving openings, which are generally standard printed circuit board holes having a specific diameter, are expanded, a desired retaining force on the press-in pins in the receiving openings being ensured by the elastic and plastic deformation of the two joining partners.

Using this technique, an additional soldering process, so-called selective soldering, which severely stresses the printed circuit board, may be avoided in many cases. Furthermore, the electrical connections established using the press-in technique are characterized by defect-free contacting and very high reliability, and due to the gas-tight and therefore corrosion-resistant connection between the press-in pins and the printed circuit board have a reliably low transmission resistance over their projected service life. In addition, press-in connections are elastic, thus allowing the interruptions and contact failures which frequently occur in soldered connections as the result of mechanical and thermal stresses during operation to be avoided.

However, due to the high press-in forces of approximately 70 to 180 N/pin which are necessary for pressing in conventional press-in pins, the regions of the printed circuit board bordering the receiving openings are also subjected to high shear forces in the direction of the press-in forces. On the one hand, these forces compel circuit designers to provide larger "off-limit zones" on the surfaces of the printed circuit board, around the junctions of the receiving openings, to avoid the occurrence of cracks in soldered-on components as the result of surface tensile stresses in the printed circuit board or a surface-printed circuit or printed conductor. As a result, however, it is possible that a portion of the printed circuit board surface is not able to be used as a circuit surface. On the other hand, due to high localized mechanical stress on the printed circuit board around the receiving opening, pushing in a press-in pin results in a so-called "jet effect," a deformation of the printed circuit board bordering the receiving opening caused by shear forces. For multilayer printed circuit boards, this jet effect entails the risk of conductive metallic inner layers breaking away as the result of extreme tensile stresses. In addition, there is the risk that a soft metallic sliding layer on the surface of the press-in pins, necessary for pressing in the pin in an operationally reliable manner, may be partially scraped away from the pins when being pressed in from the opening edges of the receiving openings, thus forming chips or flakes which under unfavorable conditions may result in short circuits at other locations on the printed circuit board, and thus, functional failure.

On this basis, an object of the present invention is to improve a press-in pin and a method of the type described at the outset in such a way that the above-referenced disadvantages may be avoided.

SUMMARY OF THE INVENTION

An object is achieved according to the present invention by the features described herein. Accordingly, the contact part of the pin may be expanded transversally to the insertion direction after insertion into the receiving opening, so that the contact part may be inserted into the receiving opening in a contactless manner or with a sliding fit to position the pin, and may be subsequently deformed within the receiving opening by expansion to seat the pin and for contacting same in order to anchor the contact part in the receiving opening with a press fit as a result of the deformation.

By use of the features according to the present invention, inner layers of the printed circuit board are only still compressed transversally to the insertion direction, whereas, in contrast to known pins, shear forces and a resulting tensile stress in the inner layers may be prevented, and the jet effect and the associated risk of breaking away of an inner layer may thus be avoided. In addition, the pin according to the present invention may be positioned in the receiving opening of the printed circuit board without application of force and without the risk of forming chips or flakes. In turn, this means that the soft metallic sliding layer on the surface of the pin, which reduces the friction between the border wall of the receiving opening and the contact part for known pins when the pins are pressed in, may be dispensed with, so that instead of the sliding layer usually made of tin, the pin may be provided with a surface coating composed of nickel, or nickel and tin, resulting in savings for the electroplating of the pins.

Within the scope of the present invention, "contact part" refers to the portion of the pin located inside the receiving opening in the printed circuit board which may be brought into electrical contact with the printed conductors or printed circuits of the printed circuit board.

According to one preferred embodiment of the present invention, the pin includes two adjacently extending leg elements in the region of the contact part which are separated by a gap or interspace, and which on the one hand impart a slender shape to the contact part which simplifies insertion into the receiving opening, but which on the other hand expand transversally to the insertion direction by application of oppositely directed longitudinal forces outside the receiving opening, with bending inside the receiving opening, thus allowing the contact part to be anchored in the receiving opening with a press fit.

To simplify manufacture of the contact part composed of two leg elements, the leg elements are preferably joined together in one piece, expediently via an end portion of the pin which faces the front in the insertion direction and which upon insertion of the pin moves through the receiving opening and projects beyond the opposite side of the printed circuit board as soon as the contact part is located inside the receiving opening.

According to a further preferred embodiment of the present invention, one of the two leg elements has a free end, bent toward the other leg element, having a force introduction surface facing away from the printed circuit board, on which a deformation force used for deforming the leg elements may be introduced in the insertion direction, using a setting tool, into the leg element provided with the force introduction surface, and after partial bending of same may also be introduced into the other leg element. During introduction of the deformation force, the end part of the pin projecting beyond the printed circuit board is supported by an anvil or abutment which introduces a reaction force, opposing the deformation force, into the two leg elements, which as a result are pushed together between the setting tool and the abutment or anvil and are therefore bent apart and expanded inside the receiving opening. It is practical for the anvil or abutment to also form a stop for the end part of the pin in order to limit the insertion depth of the pin to a desired degree upon insertion into the receiving opening, thus allowing optimal contacting due to the deformation of the contact part.

In principle, the force required for positioning the pin in the receiving opening may likewise be introduced by the setting tool into the force introduction surface of the one leg element of the contact part, but is advantageously exerted on an additional force introduction surface which faces away from the printed circuit board and which may expediently be provided on a laterally protruding projection of the pin.

For positioning of the contact part in the receiving opening, the contact part is inserted from one side of the printed circuit board into the receiving opening in a contactless manner or with a sliding fit until the front end part of the pin strikes against the abutment or anvil when the contact part has reached the optimal position for contacting the printed circuit board. The contact part is then anchored in the receiving opening by deformation with a press fit by the fact that, in a further preferred embodiment of the present invention, a portion of the contact part is pressed together in the insertion direction between the abutment or anvil and a setting tool, which is expediently pressed against a force introduction surface of the contact part facing away from the printed circuit board.

DETAILED DESCRIPTION

Figure 1:
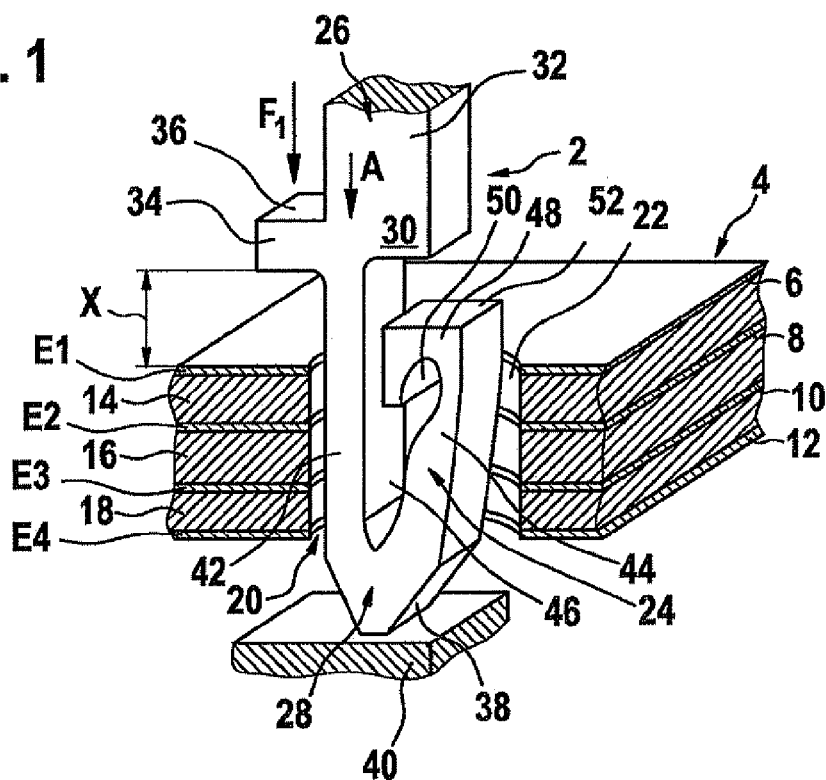
FIG. 1 shows a perspective view of an exemplary embodiment of a pin according to the present invention after being introduced into a receiving opening in a printed circuit board.

Pin 2 illustrated in the Figures is used to establish a solder-free electrical connection between a printed circuit board 4 and an electrical or electronic component (not shown) which is to be subsequently mounted on printed circuit board 4, and from which pin 2, optionally together with additional pins, for example as part of a so-called male connector (not shown), projects.

Multilayer printed circuit board 4 illustrated in the Figures, for example printed circuit board 4 of an airbag control device of a motor vehicle, has a total of four interspaced conductor planes E1, E2, E3, E4, in each of which a printed circuit 6, 8, 10, 12 in the form of printed conductors made of a thin copper layer provided with recesses is situated. Two printed circuits 6 and 12 are located on the oppositely situated broadside surfaces of printed circuit board 4 and in each case form an outer layer, and two printed circuits 8 and 10 are located inside printed circuit board 4 and form two inner layers which are separated from one another and from printed circuits 6, 12 in the outer layers by insulating layers 14, 16, 18 made of a prepreg material of printed circuit board 4. Printed circuits 6, 8, 10, 12 in the four layers are interconnected by feedthroughs (not shown) or using soldering pins (not shown) having pre-installed electronic components (not shown) on the top side of printed circuit board 4.

For accommodating pin 2, printed circuit board 4 is provided with a standard printed circuit board hole 20 at a position corresponding to pin 2, the hole extending through entire printed circuit board 4, including the four printed circuits 6, 8, 10, 12 or copper layers, the layers which pin 2 is to contact, in the present case all four layers, being exposed on cylindrical boundary wall 22 of printed circuit board hole 20, as illustrated most clearly in FIG. 1, and the layers which pin 2 is not to contact being provided with a recess surrounding printed circuit board hole 20.

Pin 2, which is manufactured by punching from sheet metal, is composed essentially of a contact part 24 which may be inserted from the top side of printed circuit board 4, in the direction of arrow A in FIG. 1, into printed circuit board hole 20, and after insertion into hole 20 may be mechanically expanded transversally to the insertion direction, and a connecting or shaft part 26 (only partially shown) which connects contact part 24 to the electronic component, and a free end part 28 from which, after insertion of contact part 24 into printed circuit board hole 20, the former 26 projects beyond the top side of printed circuit board 4, i.e., printed circuit 6, and the latter 28 projects beyond the lower side of printed circuit board 4, i.e., printed circuit 12. Connecting or shaft part 26, contact part 24, and end part 28 are delimited by two oppositely situated side surfaces 30 which lie in two parallel planes corresponding to the broadside surfaces of the sheet metal used for the punching.

At the lower end of a thickened upper part 32, connecting or shaft part 26 has a projection 34 which protrudes on one side and whose top side 36 facing away from printed circuit board 4 is flattened and is oriented perpendicular to insertion direction A, so that, using a setting tool (not shown) of a setting machine, an introduction force $F_1$ (FIG. 1) may be exerted in insertion direction A on projection 34, and thus on pin 2, in order to insert contact part 24 far enough into printed circuit board hole 20 that free end 38 of tapered end part 28 strikes against an abutment formed by an anvil 40, and a lower side of projection 34 facing printed circuit board 4 is at a predetermined distance x from the top side of printed circuit board 4, i.e., printed circuit 6.

Contact part 24, which may be anchored by being expanded inside printed circuit board hole 20, is composed essentially of two leg elements 42, 44 which are oriented approximately parallel to insertion direction A and are separated by an interspace 46, each of the lower ends of the leg elements being joined together to form one piece with the aid of end part 28. In the deformed state (FIG. 1) each of the two leg elements 42, 44 has an outer side parallel to insertion direction A and an inner side facing interspace 46.

The distances between the two outer sides, i.e., the distances between two side surfaces 30, are adjusted to the inner diameter of printed circuit board hole 20 in such a way that not only tapered end part 28 but also contact part 24 may be inserted into printed circuit board hole 20 either in a completely contactless manner or with a sliding fit, i.e., with sliding contact between the corners of leg elements 42, 44 and boundary wall 22 but without deformation of leg elements 42, 44 or of boundary wall 22, so that a relatively small introduction force $F_1$ of several N is sufficient to position pin 2.

Leg element 42 extends downward in a straight line from thickened upper part 32 of connecting or shaft part 26, i.e., from the lower side of projection 34, through printed circuit board hole 20 until reaching end part 28, and has an inner side parallel to the outer side of the leg element, while leg element 44 extends upwardly on the other side of interspace 46 from end part 28, but upper end 48 of this leg element is bent inwardly toward leg element 42 in a hook shape. The inner side of leg element 44 diverges upwardly from end part 28, initially away from the inner side of leg element 42, and then extends along a curve 50 toward leg element 42, and viewed as a whole has the approximate shape of the upper part of a question mark.

Bent upper end 48 of leg element 44 has an upwardly pointing flattened end face 52 which is oriented perpendicular to insertion direction A and whose distance from the overlying bottom side of thickened upper part 32 of connecting or shaft part 26 is sufficiently large to insert the setting tool (not shown), used to anchor contact part 24, between these two surfaces and to use the setting tool to exert a deformation force $F_2$ (FIG. 2), acting in insertion direction A, on end face 52 so that as the result of deforming contact part 24 the electrical contact is established between pin 2 and layers 6, 8, 10, 12 of printed circuit board 4.

Figure 2:
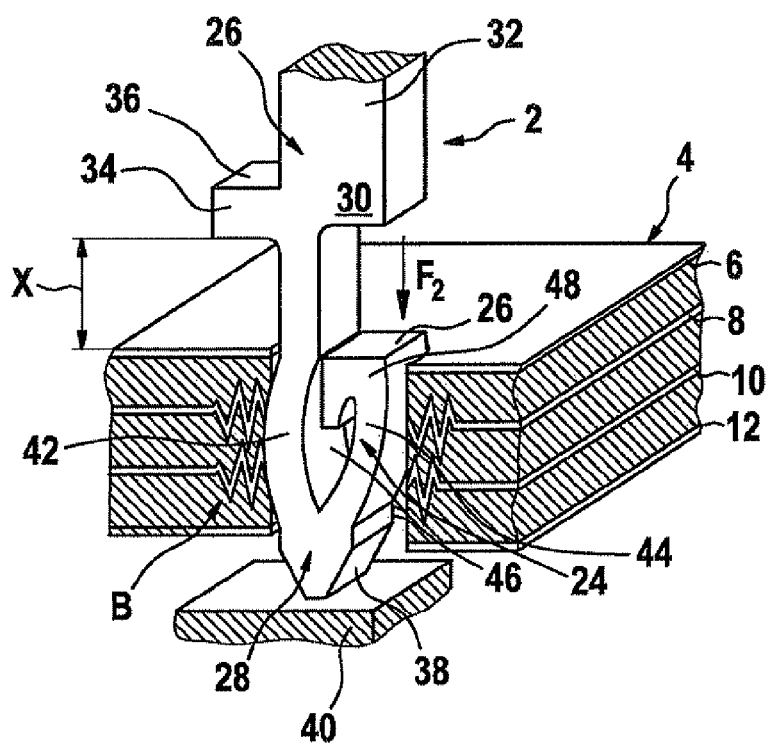
FIG. 2 shows a perspective view of the exemplary embodiment of the pin and the receiving opening after setting of the pin and contacting of the printed circuit board.

The deformation force exerted on end face 52 causes leg element 44 to be compressed or squeezed together in the longitudinal direction between the setting tool and abutment or anvil 40, as illustrated in FIG. 2, hook-shaped, inwardly bent upper end 48 of leg element 44 initially approaching the inner side of other leg element 42 and then being pressed against the latter before both leg elements 42, 44 are then bent apart, with expansion of contact part 24 transversally to insertion direction A, and each being pressed against an adjacent section of boundary wall 22 of printed circuit board hole 20. Printed circuit board 2 at inner layers 8, 10 is first compressed in the region of the corners of leg elements 42, 44, and is then also compressed opposite from the outer sides of leg elements 42, 44, transversally to insertion direction A, as illustrated by arrow B at the indicated location in FIG. 2, until ultimately contact part 24 is securely anchored in printed circuit board hole 20 with a press fit, and pin 2 is held by printed circuit board 4 with a sufficient retaining force.

Using the described procedure, the jet effect in printed circuit board 4 may be avoided, thereby allowing the quality of printed circuit board 4 to be maintained upon insertion of pin 2 and the service life of the printed circuit board to be prolonged. In addition, removal of chips or flakes from the surface of pin 2 during positioning or setting of same is avoided, so that coating of the surface with a soft metallic sliding layer made of tin, for example, may be dispensed with. Since the direction of the introduction of forces $F_1$ and $F_2$ is the same for the positioning and contacting of pin 2, short cycle times may also be achieved for both processes.

What is claimed is:

1. A pin, comprising:
   a contact part configured to be inserted into a receiving opening in a printed circuit board and anchored in the receiving opening with a press fit; and
   two adjacently extending leg elements in a region of the contact part, wherein in response to a deformation force applied against a free end of a first leg element, the two leg elements are configured to press against one another before deflecting away towards a final position in which the two leg elements are permanently deformed to produce a transversal expansion of the contact part, thereby creating the press fit.

2. The pin according to claim 1, wherein the leg elements are joined together in one piece via an end portion facing a front of the insertion direction.

3. The pin according to claim 1, wherein the free end of the first leg element is bent towards the other leg element when the leg elements are in a non-deformed state.

4. The pin according to claim 3, further comprising:
   a force introduction surface, facing away from the printed circuit board, at the bent end of the leg element.

5. The pin according to claim 4, further comprising:
   an additional force introduction surface facing away from the printed circuit board.

6. The pin according to claim 1, further comprising:
   a surface coating composed of one of nickel, and nickel and tin.

* * * * *